(12) United States Patent
Zeng (10) Patent No.: US 11,317,544 B1
(45) Date of Patent: Apr. 26, 2022

(54) WIRELESS CHARGER, CHARGING ASSEMBLY, MATCHING ASSEMBLY AND BRACKET FOR ELECTRIC EQUIPMENT

(71) Applicant: Shenzhen KE RUI ER TE Electronics Technology Co., Ltd, Shenzhen (CN)

(72) Inventor: Jianming Zeng, Shenzhen (CN)

(73) Assignee: SHENZHEN KE RUI ER TE Electronics Technology Co., Ltd, Shenzhen (CN)

( * ) Notice: Subject to any disclaimer, the term of this patent is extended or adjusted under 35 U.S.C. 154(b) by 0 days.

(21) Appl. No.: 17/355,429

(22) Filed: Jun. 23, 2021

(51) Int. Cl.
| | | |
|---|---|---|
| *H05K 7/20* | (2006.01) | |
| *H02K 1/20* | (2006.01) | |
| *H02J 50/00* | (2016.01) | |
| *H02J 7/02* | (2016.01) | |
| *H02J 7/00* | (2006.01) | |
| *H02J 50/10* | (2016.01) | |

(52) U.S. Cl.
CPC ............ *H05K 7/209* (2013.01); *H02J 7/0042* (2013.01); *H02J 7/02* (2013.01); *H02J 50/10* (2016.02); *H02K 1/20* (2013.01); *H05K 7/20154* (2013.01); *H05K 7/20909* (2013.01)

(58) Field of Classification Search
None
See application file for complete search history.

(56) References Cited

U.S. PATENT DOCUMENTS

| | | | | |
|---|---|---|---|---|
| 10,523,037 | B2* | 12/2019 | Files ................... | H02J 7/00034 |
| 11,013,149 | B2* | 5/2021 | Kim ..................... | H04M 1/026 |
| 11,089,891 | B2* | 8/2021 | Alexander .......... | A47J 31/4457 |
| 11,159,891 | B2* | 10/2021 | Kim ....................... | G06F 1/1637 |
| 2019/0222061 | A1* | 7/2019 | Koyanagi ............ | H01F 27/2804 |
| 2020/0044482 | A1* | 2/2020 | Partovi ................. | G06F 1/1683 |
| 2020/0169816 | A1* | 5/2020 | Kim ......................... | H04R 7/04 |
| 2020/0212726 | A1* | 7/2020 | Hwang ................. | H02J 50/005 |
| 2021/0184476 | A1* | 6/2021 | Zeng ..................... | H02J 7/0044 |

* cited by examiner

*Primary Examiner* — Courtney L Smith
(74) *Attorney, Agent, or Firm* — Maier & Maier, PLLC (57) ABSTRACT

A wireless charger, charging assembly, matching assembly and bracket for electric equipment, including: cold conduction plate, power interface, wireless charging module, semiconductor cooling sheet and heat dissipation module; power interface couples with wireless charging module and semiconductor cooling sheet respectively; cold conduction plate includes first and second cold conduction surface, first cold conduction surface sticks to electronic equipment, second cold conduction surface covers semiconductor cooling sheet; when powered on, wireless charging module charges electronic equipment, semiconductor cooling sheet cools down electronic equipment, heat dissipation module dissipates heat from semiconductor cooling sheet. By arranging semiconductor cooling sheet on side of wireless charging module sticking to electronic equipment, cooling down electronic equipment; arranging heat dissipation module on another side, dissipating heat on another end, guarantee temperature balance of the semiconductor cooling sheet, having solved effectively problem of heat generation when wireless charging electronic equipment, and affecting charging efficiency.

19 Claims, 8 Drawing Sheets

WIRELESS CHARGER, CHARGING ASSEMBLY, MATCHING ASSEMBLY AND BRACKET FOR ELECTRIC EQUIPMENT

FIELD

The present invention relates to the technical field of electronic device accessories, and more particularly, to a wireless charger, a charging assembly, a matching assembly and a bracket for an electric equipment.

BACKGROUND

With a continuous popularity of a plurality of electronic devices and a development of a wireless charging technology, a user has put forward a higher and higher requirement for a portability of charging an electronic device, and a wireless charging has gradually become a new trend.

In the prior art, in order to improve a charging efficiency, it has been derived a high-power fast charging and a high-power wireless charger have been derived. However, since a wireless charger require a higher power, and the higher power means bringing a higher heat generation, making a temperature of the wireless charger and the electronic devices rise, while an excessively high temperature will affect a charging efficiency, and even cause the charger or the electronic devices broken. In an embodiment, when a wireless charger is charging an intelligent terminal, in order to improve a charging speed, inside the wireless charger, it will perform a high-load work, and this will lead to a higher heat generation, transferring the heat to the intelligent terminal. When the temperature of the intelligent terminal reaches a certain threshold, in order to protect a plurality of internal components of the intelligent terminal, the intelligent terminal will greatly reduce a charging power to limit the temperature from rising further, which will greatly reduce a wireless charging efficiency. Therefore, a charging efficiency of the wireless charger in the current technology is relatively low, which affects a user experience.

Therefore, the current technology needs to be improved and developed.

SUMMARY

According to the defects in the prior art described above that an intelligent terminal lowers the charging power due to a temperature being over high, the purpose of the present invention is providing a wireless charger for an electric equipment, and a heat dissipater for an electric equipment.

In order to achieve the above mentioned goals, the technical solution of the present disclosure to solve the technical problems is as follows:

A wireless charger for an electronic equipment, wherein the wireless charger for the electronic equipment comprising:

a cold conduction plate, a power interface, a wireless charging module, a semiconductor cooling sheet, and a heat dissipation module; the power interface couples with the wireless charging module and the semiconductor cooling sheet respectively;

the cold conduction plate comprises a first cold conduction surface and a second cold conduction surface, the first cold conduction surface is applied to sticking to the electronic equipment, and the second cold conduction surface is applied to covering the semiconductor cooling sheet;

when the power interface is powered on, the wireless charging module charges the electronic equipment, the semiconductor cooling sheet cools down the electronic equipment, and the heat dissipation module dissipates heat from the semiconductor cooling sheet.

The wireless charger, wherein the wireless charging module sticks to the second cold conduction surface, when the power interface is powered on, the semiconductor cooling sheet cools down the wireless charging module.

The wireless charger, wherein the heat dissipation module comprising: a heat dissipation fan and a heat dissipation fin, the heat dissipation fin has a through hole arranged to form an accommodation space, the heat dissipation fan is accommodated in the through hole, the heat dissipation fan couples with the power interface; when the power interface is powered on, the heat dissipation fan facilitates the heat dissipation fin to dissipate the heat from the semiconductor cooling sheet.

The wireless charger, wherein the wireless charger for the electronic equipment further comprising: a heat conduction plate, the heat conduction plate comprises a first heat conduction surface and a second heat conduction surface, the first heat conduction surface sticks to the semiconductor cooling sheet, and the second heat conduction surface is covering the heat dissipation fin, the heat conduction plate is applied to facilitating the heat dissipation fin and the heat dissipation fan to dissipate heat from the semiconductor cooling sheet.

The wireless charger, wherein the wireless charger for the electronic equipment further comprising: a heat isolation plate, the heat isolation plate is arranged between the heat conduction plate and the wireless charging module, the heat isolation plate is applied to blocking the heat conduction plate from transferring heat to the wireless charging module.

A wireless charging assembly, wherein the wireless charging assembly comprising:

a wireless charging connector, comprising: a first protection shell and the wireless charging module arranged in the first protection shell;

a cooling connector, comprising: a second protection shell, the semiconductor cooling sheet and the heat dissipation module, both arranged in the second protection shell;

the first protection shell is a heat conduction shell, a size of the first protection shell matches the size of the second protection shell, and the first protection shell connects magnetically to the second protection shell.

The wireless charging assembly, wherein the wireless charging module is embedded inside the first protection shell, a side of the wireless charging module has a first printed circular board arranged, the first printed circular board has a first power interface arranged, the first printed circular board electrically connects to the wireless charging module.

The wireless charging assembly, wherein an embossed engaging portion is arranged above the first protection shell, and the embossed engaging portion has a first mated mounting ring engaged and arranged;

a width of the first mated mounting ring is as same as a height of the embossed engaging portion, the first mated mounting ring is sleeved on a side of the embossed engaging portion; a diameter of the first mated mounting ring matches a diameter of the first protection shell.

The wireless charging assembly, wherein the first protection shell has a bottom plate arranged on a bottom of a side against the first mated mounting ring, the bottom plate is an original magnet bottom plate;

a side of the wireless charging module sticking to the first printed circular board has further a magnet isolation plate arranged, the magnet isolation plate is applied to improving an efficiency of the wireless charging module.

The wireless charging assembly, wherein the semiconductor cooling sheet is arranged inside the second protection shell, the heat dissipation module is arranged an end of the semiconductor cooling sheet dissipating the heat, the second protection shell has a plurality of heat dissipation holes arranged, the heat dissipation holes is applied to conducting the heat from the heat dissipation module.

The wireless charging assembly, wherein a side of the semiconductor cooling sheet sticking to the heat dissipation module has a second printed circular board arranged, a center position of the second printed circular board has amounting hole arranged, a shape of the mounting hole is as same as a shape of a cross section of the semiconductor cooling sheet, the semiconductor cooling sheet is embedded in and electrically connected to an inside of the mounting hole, the semiconductor cooling sheet sticks to the heat dissipation module.

The wireless charging assembly, wherein the heat dissipation module comprises a plurality of heat dissipation fins, the plurality of heat dissipation fins are arranged fixedly into a radial shape, the heat dissipation fins are made of a heat conductive metal;

the heat dissipation module further comprises a heat dissipation fan, the heat dissipation fan is arranged at a center position of the heat dissipation fin, and electrically connected to the second printed circular board.

The wireless charging assembly, wherein a cooling side of the second printed circular board facing to the semiconductor cooling sheet has a second mated mounting ring arranged, an inner diameter of the second mated mounting ring is larger than a diameter of a cross section of the semiconductor cooling sheet, the second mated mounting ring is sleeved on the semiconductor cooling sheet and fixedly arranged on the second printed circular board, the second mated mounting ring is a permanent magnet ring.

The wireless charging assembly, wherein the second printed circular board has a temperature sensor and a second power interface arranged, the temperature sensor is applied to controlling a temperature of the heat dissipation module, the second power interface is applied to supplying power to the semiconductor cooling sheet.

The wireless charging assembly, wherein an inside of the second protection shell further has a cold conduction plate arranged, a side of the cold conduction plate sticks to the semiconductor cooling sheet, another side thereof sticks to the first protection shell.

A matching assembly of the wireless charger, wherein the matching assembly of the wireless charger comprises the wireless charging assembly described above;

the matching assembly of the wireless charger further comprises:

a mobile terminal protection shell, the mobile terminal protection shell has a magnetic connector arranged, a position of the magnetic connector arranged is corresponding to a wireless charging position of the mobile terminal, the magnetic connector is applied to fixing the mobile terminal protection shell onto the wireless charging assembly.

The matching assembly, wherein the mobile terminal protection shell is a heat conductive protection shell.

The matching assembly, wherein a side of the mobile terminal protection shell applied to amounting a mobile terminal has a recessed mounting part arranged, a shape of the recessed mounting part is as same as a shape of the magnetic connector, the magnetic connector is embedded in the recessed mounting part.

The matching assembly, wherein the magnetic connector is a round ring-shaped component, and the magnetic connector is a magnetization sheet.

The matching assembly, wherein an inside of the mobile terminal protection shell has a heat conductive layer arranged, the heat conductive layer clamps and fixes the magnetic connector to an inside of the mobile terminal protection shell.

A wireless charging bracket, wherein the wireless charging bracket comprises the wireless charging assembly described above;

the wireless charging bracket further comprises:

a support assembly, the wireless charging assembly is detachably arranged on the support assembly, the support assembly is applied to supporting the mobile terminal, and wireless charging through the wireless charging assembly.

The wireless charging bracket, wherein the support assembly has an assembly hole arranged, the assembly hole matches a size of the first protection shell, the wireless charging assembly is snapped and arranged in the assembly hole.

The wireless charging bracket, wherein an inner wall of the assembly hole has a touch switch arranged, when the wireless charging assembly is arranged inside the assembly hole, the touch switch is coupled with the wireless charging assembly.

The wireless charging bracket, wherein the support assembly has a cooling unit arranged inside, the cooling unit is applied to cooling down a temperature of the wireless charging assembly, the support assembly further has a location unit arranged, the location unit is applied to fixing the support assembly.

The wireless charging bracket, wherein the cooling unit comprises a semiconductor cooling sheet, a heat dissipation fin, and a thermal conductive sticker, the thermal conductive sticker sticks to the first protection shell and the second protection shell, a cooling end of the semiconductor cooling sheet sticks to the thermal conductive sticker, a heat dissipation end of the semiconductor cooling sheet sticks to a heat discharging sheet group.

The wireless charging bracket, wherein a side of the support assembly sticking to the mobile terminal has an enhanced sticker arranged, the enhancing sticker is a permanent magnet ring.

Benefits: the present disclosure arranges a semiconductor cooling sheet on a side of the wireless charging module, and the semiconductor cooling sheet sticks to an electronic equipment through a cold conducting surface, thereby achieving an effect of cooling down the electronic equipment. At a same time, another side has a heat dissipation module arranged, while the heat dissipation module is able to achieve an effect of dissipating heat on another end of the semiconductor cooling sheet, so as to ensure a temperature of the semiconductor cooling sheet being kept maintaining at a certain state, which has solved effectively a problem of heat generation when wireless charging an electronic equipment, and affecting the charging efficiency.

DETAILED DESCRIPTION OF THE EMBODIMENTS

In order to make the purpose, technical solution and the advantages of the present invention clearer and more explicit, further detailed descriptions of the present invention are stated here, referencing to the attached drawings and some embodiments of the present invention. It should be understood that the detailed embodiments of the invention described here are used to explain the present invention only, instead of limiting the present invention.

It should be noted that if there are a plurality of directional indications (such as up, down, left, right, front, back and more) in the embodiments of the present disclosure, the directional indications are only used to explain a relative positional relationship, a movement condition, and more, in a certain posture between each component (as shown in a plurality of drawings accompanied), if a specific posture changes, the directional indications will also change accordingly.

In addition, if there are a plurality of descriptions related to "first", "second", and more, in the embodiments of the present disclosure, the descriptions of "first", "second", and more, are used only for a descriptive purpose, and cannot be understood as an instruction or an Implication to a relative importance thereof or an implicit indication of a number of a plurality of technical features indicated. Therefore, a feature defined with "first" and "second" may explicitly or implicitly comprise at least one of the features. In addition, a plurality of technical solutions between a plurality of various embodiments can be combined with each other, but it must be based on what can be achieved by an ordinary skilled in the art. If a combination of the technical solutions is contradictory or cannot be achieved, it should be considered that such a combination of the technical solutions neither exist, nor within a scope of protection required by the present disclosure.

In the prior art, in order to improve a charging efficiency, a high-power fast charging and a high-power wireless charger have been developed. However, since a wireless charger requires a higher power, and a higher power means a higher heat generation, making a temperature of the wireless charger and the electronic device rise, while an excessively high temperature will affect the charging efficiency, and even cause a damage to the charger or the electronic device. In an embodiment, when the wireless charger is charging a smart terminal, in order to improve a charging rate, the wireless charger will perform a high-load work inside, which will bring a higher heat generation, and the heat is made to transfer to the smart terminal, when a temperature of the smart terminal has reached a certain threshold, in order to protect a plurality of internal components of the smart terminal, the smart terminal will reduce a charging power greatly to limit the temperature from continuing to rise, which will greatly reduce the wireless charging efficiency. Therefore, the charging efficiency of the wireless charger in the prior art is relatively low, affecting a user's experience.

According to a plurality of problems in the prior art stated above, the present disclosure provides a wireless charger, a charging assembly, a matching assembly and a bracket for an electric equipment. Shown as FIG. 1 and FIG. 2, the wireless charger for the electric equipment comprises: a cold conduction plate 260, a power interface 281, a wireless charging module 120, a semiconductor cooling sheet 220, and a heat dissipation module 230; the power interface 281 couples with the wireless charging module 120 and the semiconductor cooling sheet 220 respectively; the cold conduction plate 260 comprises a first cold conduction surface 261 and a second cold conduction surface 262, the first cold conduction surface 261 is applied to sticking to the electronic equipment, and the second cold conduction surface 262 is applied to covering the semiconductor cooling sheet 220; when the power interface 281 is powered on, the wireless charging module 120 charges the electronic equipment, the semiconductor cooling sheet 220 cools down the electronic equipment, and the heat dissipation module 230 dissipates heat from the semiconductor cooling sheet 220.

Figure 1:
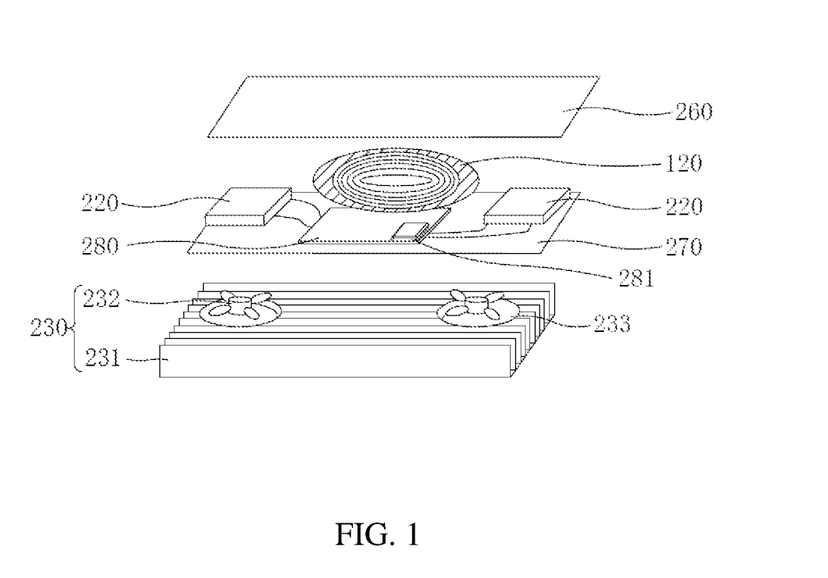
FIG. 1 illustrates a structural diagram on a wireless charger for an electric equipment in the present disclosure.

The present disclosure arranges a semiconductor cooling sheet 220 on a side of the wireless charging module 120, to lower a temperature of the electric equipment, and arranges a heat dissipation module 230 on another side, to achieve an effect of dissipating the heat on another end of the semiconductor cooling sheet 220, ensuring a temperature balance of the semiconductor cooling sheet 220, and having solved effectively a problem of heat generation during a wireless charging process of an electronic equipment, and affecting the charging efficiency.

In the embodiment described above, shown as FIG. 1, the wireless charger for the electric equipment, wherein the cold conduction plate 260 is made by a plurality of non-metal heat conductors, including aluminum oxide, heat conducting ceramics and more. Shown as FIG. 2, the cold conduction plate 260 is a flat plate shaped component, comprising specifically the first cold conduction surface 261 and the second cold conduction surface 262, in an implementation, the second cold conduction surface 262 covers the semiconductor cooling sheet 220, the first cold conduction surface 261 is applied to sticking to the electronic equipment, when the power interface 281 is powered on, the wireless charging module 120 charges the electronic equipment, the semiconductor cooling sheet 220 cools down the electronic equipment, and the heat dissipation module 230 dissipates heat from the semiconductor cooling sheet 220. The present embodiment, wherein the electronic equipment may be a mobile terminal, a platelet computer, a laptop computer, and more.

Figure 2:
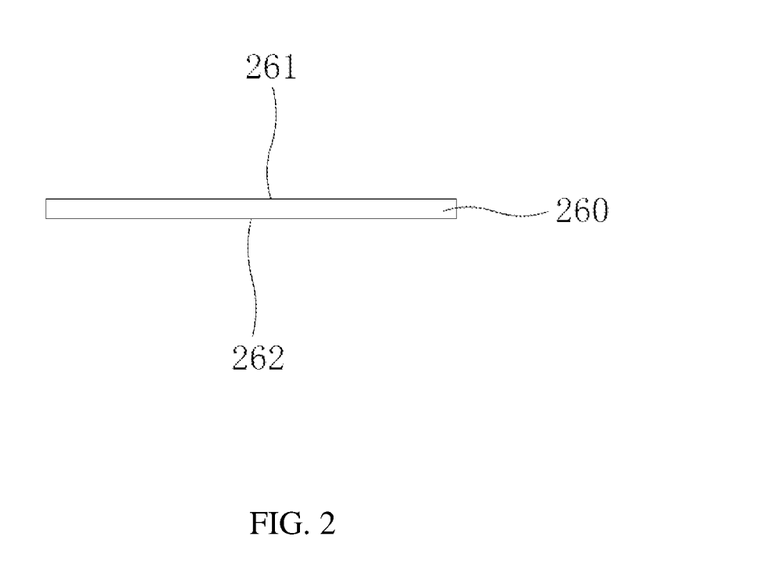
FIG. 2 illustrates a cross-sectional diagram on a cold conduction plate in the wireless charger for the electric equipment in the present disclosure.

In a real application, a number of the semiconductor cooling sheet 220 may be one or at least two; when the power interface 281 is powered on, the wireless charging module 120 wireless charges the mobile terminal, an end of the semiconductor cooling sheet 220 close to the mobile terminal is a cold end, and an end close to the heat dissipation module 230 is a hot end, while the cold end of the semiconductor cooling sheet 220 absorbs heat from the mobile terminal through the cold conduction plate 260, and the hot end dissipates heat out through the heat dissipation module 230. In the embodiments of the present disclosure, when the wireless charger for the electronic equipment is charging a mobile terminal, it is able to provide a cooling effect actively to the mobile terminal, thereby reducing an occurrence of the mobile terminal reducing the charging power due to an over high temperature when in charging. The mobile terminal may be arranged lying on the first cold conduction surface 261 before sticking to the cold conduction plate 260, and the second cold conduction surface 262 of the cold conduction plate 260 covers the semiconductor cooling sheet 220, so that a back of the mobile terminal is arranged lying on the charger, which is able to improve the charging efficiency, as well as increasing a contact area, therefore improving a cooling effect of the cold conduction plate 260.

Preferably, the wireless charging module 120 is sticking to a middle portion of the second cold conduction surface 262, when the power interface 281 is powered on, the semiconductor cooling sheet 220 cools down the wireless charging module 120.

In a real implementation, when the wireless charger is charging an electric equipment, due to the wireless charger usually having a relatively high power, thus having a relatively high heat generation, and a wireless charging ring is a fragile component, a high temperature caused by a high heat generation may break the charging ring, according to this point, an embodiment of the present disclosure, wherein the wireless charging module 120 is sticking to the middle portion of the second cold conduction surface 262, when the wireless charger for the electronic equipment is wireless charging the electronic equipment, the semiconductor cooling sheet 220 will not only cool down the electronic equipment, but also cool down the wireless charging module 120 through the cold conduction plate 260, so the temperature of the wireless charging module 120 is able to be controlled relatively low, reducing an occurrence of a case that the wireless charging module 120 is broken due to an over high temperature. In a real charging process, the electronic equipment is usually arranged lying on the middle portion of the cold conduction plate 260, and a frequency of the middle portion of the cold conduction plate 260 sticking to the electronic equipment is also relatively high. Thus arranging the wireless charging module 120 on the middle portion of the cold conduction plate 260, may further improve the wireless charging efficiency.

Preferably, the heat dissipation module 230 comprises a heat dissipation fan 232 and a heat dissipation fin 231; the heat dissipation fin 231 has a through hole 233 arranged to form an accommodation space, the heat dissipation fan 232 is accommodated in the through hole 233, the heat dissipation fan 232 couples with the power interface 281, when the power interface 281 is powered on, the heat dissipation fan 232 facilitates the heat dissipation fin 231 to dissipate the heat from the semiconductor cooling sheet 220.

In an embodiment of the present disclosure, the heat dissipation module 230 has the heat dissipation fan 232 and the heat dissipation fin 231 arranged, wherein the heat dissipation fan 232 gets supplied through the power interface 281, and during a process of providing a heat dissipation for the electronic equipment, the heat dissipation fin 231 absorbs the heat generated from the hot end of the semiconductor cooling sheet 220, the heat dissipation fan 232 is able to enforce an air flow around the heat dissipation fin 231, generating a heat diffusion for the heat dissipation fin 231, thus able to diffuse the heat to an outer air faster, which has greatly improved the heat dissipation efficiency. The heat dissipation fin 231 further has the through hole 233 arranged to accommodate the heat dissipation fan 232, making a hot air carrying the heat be able to be dissipated directly to an outside of a heat dissipater, which further enhances the heat dissipation effect, and saves an inner space of the heat dissipater for the electronic equipment, reducing a volume thereof. An number of the heat dissipation fan 232 may be one or more than one, in an embodiment, when the number of the heat dissipation fan 232 is two, the semiconductor cooling sheet 220 may be two, and the through hole 233 is further arranged at an according position on a lower part of the semiconductor cooling sheet 220, making the heat dissipation effect better.

Figure 3:
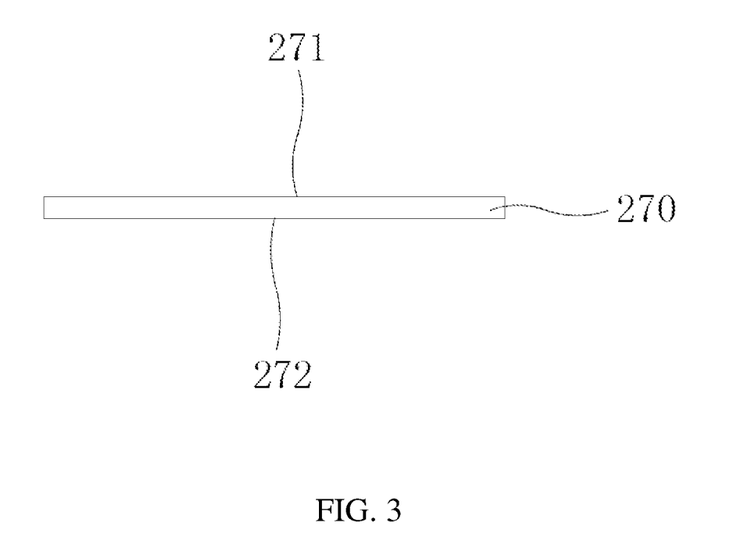
FIG. 3 illustrates a cross-sectional diagram on a heat conduction plate in the wireless charger for the electric equipment in the present disclosure.

Preferably, referencing to FIG. 3, the wireless charger for the electronic equipment further has a heat conduction plate 270 arranged, the heat conduction plate 270 comprises a first heat conduction surface 271 and a second heat conduction surface 272, the first heat conduction surface 271 sticks to the semiconductor cooling sheet 220, and the second heat conduction surface 272 is covering the heat dissipation fin 231, the heat conduction plate 270 is applied to facilitating the heat dissipation fin 231 and the heat dissipation fan 232 to dissipate the heat from the semiconductor cooling sheet 220.

Arranging a piece of heat conduction plate 270 between the heat dissipation fin 231 and the semiconductor cooling sheet 220, is able to increase a direct heat absorption area of the heat dissipation fin 231, accelerates a heat absorption to the semiconductor cooling sheet 220, making the heat generated from the hot end of the semiconductor cooling sheet 220 be transferred faster to the heat dissipation fin 231, and reducing the heat from accumulating on the hot end of the semiconductor cooling sheet 220, before achieving a better heat dissipation effect. Since the heat conduction plate 270 is mainly taking an action of heat transferring, and requiring a certain thermal conduction property, thus a material of the heat conduction plate 270 may be glass, graphene or more, there is no limitations herein.

Preferably, the wireless charger for the electronic equipment further has a heat isolation plate 280 arranged, the heat isolation plate 280 is arranged between the heat conduction plate 270 and the wireless charging module 120, the heat isolation plate 280 is applied to blocking the heat conduction plate 270 from transferring heat to the wireless charging module 120.

In a real application, the wireless charging module 120 may be arranged above the heat conduction plate 270, sticking to the cold conduction plate 260. A temperature of the heat conduction plate 270 will rise after absorbing the heat from the hot end of the semiconductor cooling sheet 220, and the heat may then be transferred to the wireless charging module 120, affecting a normal work of the wireless charging module 120. In order to block the heat from being transferred to the wireless charging module 120, the present embodiment arranges the heat isolation plate 280 between the heat conduction plate 270 and the wireless charging module 120, applied to limiting the heat transferring, thus further protecting the wireless charging module 120, and improving a reliability of the wireless charger for the electronic equipment.

Figure 4:
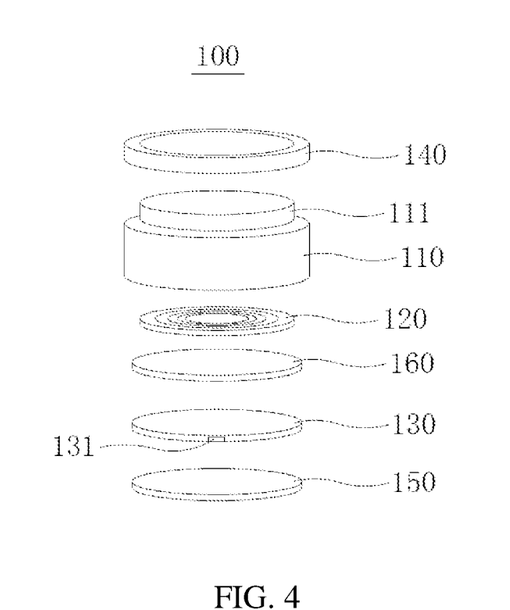
FIG. 4 illustrates a structural diagram on a wireless charging connector in a wireless charging assembly in the present disclosure.
Figure 5:
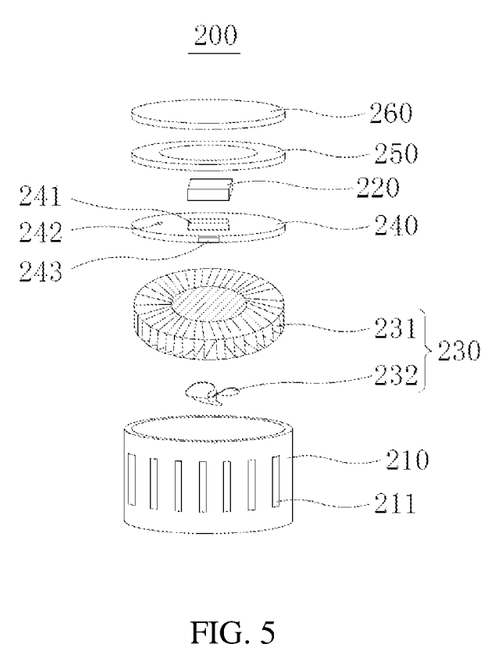
FIG. 5 illustrates a structural diagram on a cooling connector in the wireless charging assembly in the present disclosure.

According to the embodiments stated above, the present disclosure further provides a wireless charging assembly 400, shown as FIG. 4 and FIG. 5, the wireless charging assembly 400 comprises: a wireless charging connector 100 and a cooling connector 200. The wireless charging connector 100 and the cooling connector 200 may achieve a combination between each other, before forming an assembly similar to the wireless charger for the electronic equipment stated above, so as to satisfy a plurality of different usage requirements of a user.

Shown as FIG. 4, the wireless charging connector 100 stated above comprises: a first protection shell 110, and the wireless charging module 120 arranged in the first protection shell 110. Specifically, in the present embodiment, in order to ensure that the wireless charging assembly 400, after being connected with the mobile terminal, will not affect a normal usage of the mobile terminal, thus the first protection shell 110 is arranged into a round cylinder shape, the wireless charging module 120 is embedded inside the first protection shell 110, a side of the wireless charging module 120 has a first printed circular board 130 arranged, the first printed circular board 130 has a first power interface 131 arranged, the first printed circular board 130 electrically connects to the wireless charging module 120, when the first power interface 131 has an electric current induced, the electric current may enter the wireless charging module 120 through the first printed circular board 130, thereby achieving the wireless charging module 120 charging the mobile terminal.

Shown as FIG. 5, the cooling connector 200 stated above comprises: a second protection shell 210, a shape of the second protection shell 210 matches that of the first protection shell 110, the semiconductor cooling sheet 220 arranged in the second protection shell 210, and the heat dissipation module 230, wherein two sides of the semiconductor cooling sheet 220 are applied to cooling and heat dissipating respectively, a side of a cold end of the semiconductor cooling sheet 220 faces to the first protection shell 110, after the first protection shell 110 and the second protection shell 210 are combined with each other, the cold end of the semiconductor cooling sheet 220 sticks to the first protection shell 110, the hot end of the semiconductor cooling sheet 220 sticks to the heat dissipation module 230, so as to achieve a heat dissipation to the hot end of the semiconductor cooling sheet 220.

Specifically, shown as FIG. 4, the first protection shell 110 has an embossed engaging portion 111 arranged above, and the embossed engaging portion 111 has a first mated mounting ring 140 engaged and arranged. Specifically, a width of the first mated mounting ring 140 is as same as a height of the embossed engaging portion 111, the first mated mounting ring 140 is sleeved on a side of the embossed engaging portion 111; and a diameter of the first mated mounting ring 140 matches a diameter of the first protection shell 110. After an installation of the first mated mounting ring 140 is completed, it forms a cylinder having a uniform diameter with the first protection shell 110, in order to ensure a beautiful appearance and a convenience for use. The first mated mounting ring 140 is arranged as a permanent magnet ring during an actual installation, to form an engagement with the mobile terminal, in order to achieve a positioning and fixation of the mobile terminal during a wireless charging process.

More specifically, the first protection shell 110 has a bottom plate 150 arranged on a side against the first mated mounting ring 140, the bottom plate 150 is made by an original magnet material, including iron. A side of the wireless charging module 120 sticking to the first printed circular board 130 has further a magnet isolation plate 160 arranged, the magnet isolation plate 160 is applied to isolating a magnet connection between the cooling connector 200 and the bottom plate 150, and improving a charging efficiency of the wireless charging assembly 400.

According to the embodiments stated above, shown as FIG. 5, the second protection shell 210 has the semiconductor cooling sheet 220 arranged inside, the semiconductor cooling sheet 220 is sleeved and fixed inside the second protection shell 210, and the heat dissipation module 230 is arranged on an end for heat dissipation of the semiconductor cooling sheet 220. In order to ensure a heat dissipation effect, the second protection shell 210 further has a plurality of heat dissipation holes 211 arranged, when the heat dissipation module 230 starts to work, the heat dissipation module 230 dissipates the heat generated by the semiconductor cooling sheet 220 out through the heat dissipation holes 211, so as to avoid an inner temperature of the second protection shell 210 from being over high.

A side of the semiconductor cooling sheet 220 sticking to the heat dissipation module 230 further has a second printed circular board 240 arranged, the second printed circular board 240 is applied to fixing and electronically connecting to the semiconductor cooling sheet 220. Accordingly, the second printed circular board 240 further has a second power interface 243 arranged, the second power interface 243 is applied to connecting to an external power source, and supplying power to the semiconductor cooling sheet 220 and the heat dissipation module 230 through the second printed circular board 240.

Another implementation method of the present disclosure, wherein the second printed circular board 240 has a temperature sensor 242 arranged, the temperature sensor 242 is applied to controlling a temperature of the heat dissipation module 230. When the temperature of the heat dissipation module 230 exceeds a certain threshold, the temperature sensor 242 cuts off automatically an electric circuit connection relationship between the second power interface 243 and the semiconductor cooling sheet 220 as well as the heat dissipation module 230, so as to make sure that the wireless charging assembly 400 will not generate an over heat situation.

In an embodiment, when the mobile terminal just starts wireless charging, the wireless charging connector 100 and the mobile terminal have a low heat generation at this time, and the temperature sensor 242 senses a temperature in the cooling connector 200 is relatively low at this time, a predetermined program component arranged in the second printed circuit board 240 will reduce a cooling power of the semiconductor cooling sheet 220, or lower a spinning speed of the heat dissipation fan 232, thereby reducing a power consumption of a heat dissipater of the electronic equipment, or directly turning the semiconductor cooling sheet 220 off, to prevent an inside of the mobile terminal from condensation due to a temperature too low. When the mobile terminal is running a large-scale online game, the mobile terminal generates a lot of heat, while the temperature sensor 242 senses that the temperature in the cooling connector 200 is relatively high, then the predetermined program component in the second printed circuit board 240 will increase the cooling power of the semiconductor cooling sheet 220, and also increase the spinning speed of the heat dissipation fan 232. This allows a heat dissipater of the electronic equipment be able to adapt to more scenarios, while improving a user experience. A number of temperature sensors 242 may also be more than 1, while not being limited to be arranged inside the cooling connector 200. A predetermined program component on the second printed circuit board 240 may adjust a work state of the semiconductor cooling sheet 220 and the heat dissipation fan 232 according to a temperature feedback from any one or a plurality of the temperature sensors 242, therefore making a control more precisely.

The embodiments stated above, wherein shown as FIG. 5, a center position of the second printed circular board 240 has a mounting hole 241 arranged, a shape of the mounting hole 241 is as same as a shape of a cross section of the semiconductor cooling sheet 220. In a real installation, the semiconductor cooling sheet 220 is embedded in and electrically connected to an inside of the second printed circular board 240, while a side of the hot end of the semiconductor cooling sheet 220 sticks to the heat dissipation module 230 after passing through the second printed circular board 240. A benefit of such an arrangement in the present disclosure is, on one side, reducing a space required when mounting the semiconductor cooling sheet 220, on another side, having no effect on a sticking relationship between the semiconductor cooling sheet 220 and the heat dissipation module 230, thus ensuring the heat dissipation efficiency.

According to the embodiments stated above, one implementation method of the present disclosure, wherein the heat dissipation module 230 stated above comprises a plurality of heat dissipation fins 231, the plurality of heat dissipation fins 231 are arranged in a radial shape (similar to a whirlpool), the heat dissipation fins 231 are all made of a heat conductive metal, to facilitate the heat on the hot end of the semiconductor cooling sheet 220 to exchange with air through the heat dissipation fins 231. The heat dissipation module 230 further comprises a heat dissipation fan 232, the heat dissipation fan 232 is arranged at a center position of the heat dissipation fin 231, and electrically connected to the second printed circular board 240. When the second printed circular board 240 has a power supply existing, the heat dissipation fan 232 is driven to spin by an electric current, which accelerates the heat on the heat dissipation fins 231 to have a heat exchange with air.

Another implementation method of the present disclosure, wherein inside the second protection shell 210, a cooling side of the second printed circular board 240 facing to the semiconductor cooling sheet 220 has a second mated mounting ring 250 arranged, the second mated mounting ring 250 is mounted sticking to the second printed circular board 240, and an inner diameter of the second mated mounting ring 250 is larger than a maximum diameter of the semiconductor cooling sheet 220. On another side, a height of the second mated mounting ring 250 is no more than a height of the semiconductor cooling sheet 220 embossed from the second printed circular board 240, so as to avoid generating an effect on a cooling end of the semiconductor cooling sheet 220 from transferring a low temperature.

The present embodiment, wherein the second mated mounting ring 250 is made of a permanent magnetic material, and during a real application, the second mated mounting ring 250 matches with the bottom plate 150 arranged on the first protection shell 110, the bottom plate 150 of the first protection shell 110 is made of an original magnetic material, thus an magnetic amounting and fixation is achieved.

Figure 8:
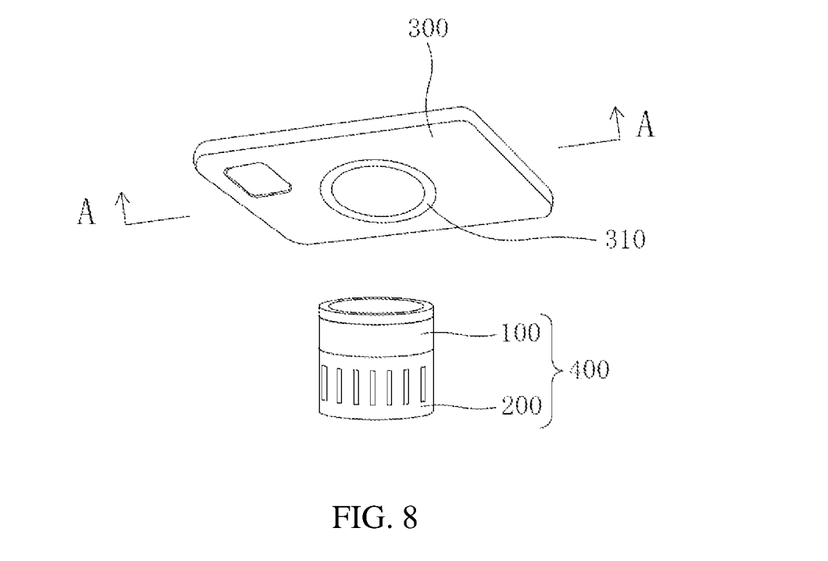
FIG. 8 illustrates a structural diagram on a matching assembly of the wireless charger in the present disclosure.

After the wireless charging connector 100 and the cooling connector 200 achieving an installation and a combination, a completed form of the combination is shown as FIG. 8. By the first mated mounting ring 140 on the wireless charging connector 100, it is able to achieve a matching, an installation and a fixation with the mobile terminal. At a same time, the wireless charging assembly 400 in a cylindrical shape will not affect a grip of a user in a game, improving the charging efficiency effectively.

The present embodiment, wherein an inside of the second protection shell 210 further has a cold conduction plate 260 arranged, a side of the cold conduction plate 260 sticks to the semiconductor cooling sheet 220, another side thereof sticks to the bottom plate 150 of the first protection shell 110. Due to the second protection shell 210 and the bottom plate 150 are both made of a thermal conduction material, thus a low temperature generated on a cooling end of the semiconductor cooling sheet 220 may be transferred to the mobile terminal through the cold conduction plate 260, the bottom plate 150 and the first protection shell 110, achieving an effect of lowering a temperature of the mobile terminal, while at a same time, lowering a temperature of the wireless charging module 120 inside the first protection shell 110, therefore ensuring that the wireless charging process will not reduce a power due to an over high temperature.

Figure 6:
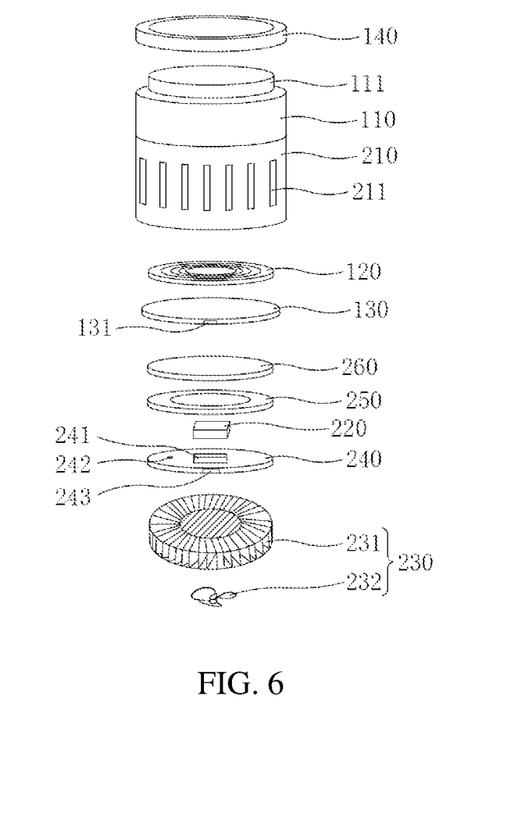
FIG. 6 illustrates a structural diagram on a second embodiment of the wireless charging assembly in the present disclosure.

Another implementation method of the present disclosure, shown as FIG. 6, wherein it is also possible to arrange the wireless charging connector 100 and the cooling connector 200 integrally, that is, the first protection shell 110 and the second protection shell 210 are connected integrally. The present embodiment, wherein the wireless charging module 120 is arranged in the first protection shell 110, below the wireless charging module 120, a first printed circular board 130 is arranged, and another side of the first printed circular board 130 has a cold conduction plate 260 stuck, applied to conducting the low temperature on the semiconductor cooling sheet 220 to the first printed circular board 130, so as to achieve a temperature reducing effect during the charging process to the wireless charging module 120.

The present embodiment, wherein the second mated mounting ring 250 is an optional component, both the first protection shell 110 and the second protection shell 210 are made by a thermal conduction material, to achieve the cooling effect by sticking to the mobile terminal. On the cooling connector 200, a plurality of other components has an arrangement no difference to the structure stated above, that is, the wireless charging connector 100 and the cooling connector 200 may be arranged into a separate combination or an integral. When manufactured into an integral is adopted, the first mated mounting ring 140 may further be arranged inside or outside of the first protection shell, so as to satisfy a usage requirement in different forms.

Figure 7:
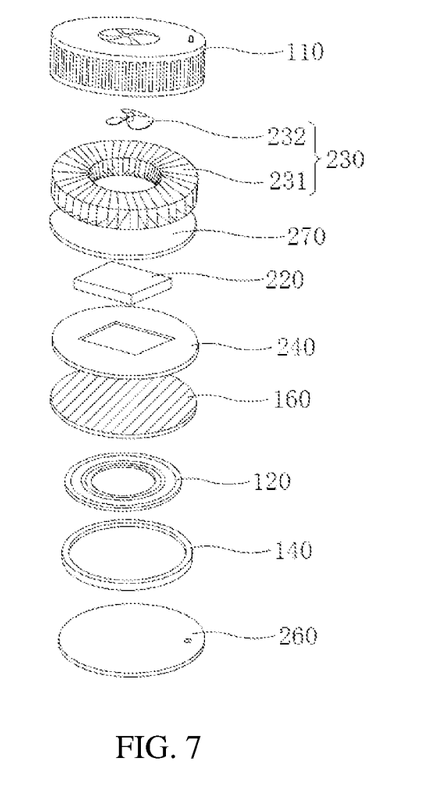
FIG. 7 illustrates a structural diagram on a third embodiment of the wireless charging assembly in the present disclosure.

Another implementation method of the present disclosure, shown as FIG. 7, wherein based on a design idea of integrating the wireless charging connector 100 and the cooling connector 200 together, the present embodiment further simplifies an integrated structure, in one embodiment shown in FIG. 7, the first protection shell 110 and the second protection shell 210 are simplified into arranging only one first protection shell. At a same time, the printed circuit boards in the wireless charging connector 100 and the cooling connector 200 are simplified into arranging only one second printed circuit board 240, at a same time, the second printed circuit board 240 has the semiconductor cooling sheet 220 engaged inside, and the heat conduction plate 270 is arranged at an end of the second printed circuit board 240 connecting with the heat dissipation module 230, to achieve a heat dissipation. Arranging a magnetic isolation sheet 160 at one end of the second printed circuit board 240 connecting to the wireless charging module 120. The magnetic isolation sheet 160 is made of a material that has both magnetic insulation and temperature conductivity, to improve the charging efficiency of the wireless charging module 120, while transferring a temperature generated by the semiconductor cooling sheet 220 to the wireless charging module 120. And a cold conduction plate 260 is arranged on another side of the wireless charging module 120. The cold conduction plate 260 may be made of a plurality of non-metallic heat conductor, including a heat conduction rubber, alumina, ceramics, and more, to achieve an effect of cooling a mobile terminal having been installed. In the present embodiment, the second printed circuit board 240 controls simultaneously an operation of the wireless charging module 120, the semiconductor cooling sheet 220, and the heat dissipation fan 232, before achieving an effect of reducing a cost, and improving an integration degree.

In the embodiment described above, it is further possible to fill a gap in the wireless charging module 120 with thermally conductive silica gel, making it own an effect of improving a heat conduction efficiency, and preventing a short circuits caused by a condensation.

All above, the present disclosure, wherein by arranging the wireless charging connector 100 and the cooling connector 200 being able to be combined, it is able to achieve an effect of lowering the temperature of the mobile terminal during a process of wireless charging the mobile terminal, and avoid an occurrence of a problem that a wireless charging efficiency of the mobile terminal is reduced caused by the temperature being over high. At a same time, the wireless charging connector 100 and the cooling connector 200 in the present disclosure may further be used separately, in an embodiment, when only the wireless charging connector 100 is arranged, it is achieved of a wireless charging to the mobile terminal; and when only the cooling connector 200 is arranged, it is achieved of an active temperature lowering to the mobile terminal, when the wireless charging connector 100 and the cooling connector 200 are combined, both the wireless charging and the temperature lowering to the mobile terminal are achieved. Thus a different usage requirement of a user is satisfied by a rich costumed function.

According to the embodiments stated above, the present disclosure further provides a matching assembly of the wireless charger, shown as FIG. 8, the matching assembly of the wireless charger comprises the wireless charging assembly 400 described in the embodiments stated above. In addition, the matching assembly of the wireless charger further comprises:

a mobile terminal protection shell 300, the mobile terminal protection shell 300 has a magnetic connector 310 arranged, a position of the magnetic connector 310 arranged is corresponding to a wireless charging position of the mobile terminal, the magnetic connector 310 is applied to combining the mobile terminal protection shell 300 and the wireless charging assembly 400, before achieving an effect of mounting and fixing.

In the prior art, for the mobile terminal, there are a plurality of types supporting the wireless charging function, while not all mobile terminals have a magnetic part matching the wireless charging assembly 400 arranged inside, that causes a problem of a misalignment with the wireless charger assembly 400 when such a class of mobile terminals is in a real application, which lowers a wireless charging speed. Thus the present disclosure, by arranging the magnetic connector 310 on the mobile terminal protection shell 300, and cooperating with the wireless charging assembly 400, before fixing the mobile terminal to a preset position, has then ensured a wireless charging corresponding relationship between the mobile terminal and the wireless charging assembly 400. Even when the user is placing the mobile terminal horizontally and holding in a hand vertically, it is still able to ensure the wireless charging assembly 400 from falling down.

There are pluralities of styles of the mobile terminal protection shell 300 existing, which are adapted to a plurality of mobile terminals in different models on market. That is, the mobile terminal protection shell 300 is used by sheathing and snapping onto the mobile terminal. The mobile terminal protection shell 300 has a magnetic connector 310 arranged, the magnetic connector 310 matches with the first mated mounting ring 140 arranged on the wireless charging connector 100, to achieve a magnetic connection, thereby fixing a heat dissipater of the mobile terminal on the mobile terminal protection shell 300. Arranging the magnetic connector 310 is according to a usage of a mobile terminal without the wireless charging function. A same configuration of the mobile terminal protection shell 300 can also achieve an effect of having a mobile terminal heat dissipater arranged.

Similarly, in a mobile terminal without the wireless charging function, the wireless charging connector 100 stated above is an optional configuration, that is, arranging the cooling connector 200 only, to achieve a body cooling effect when running a large software program.

Figure 9:
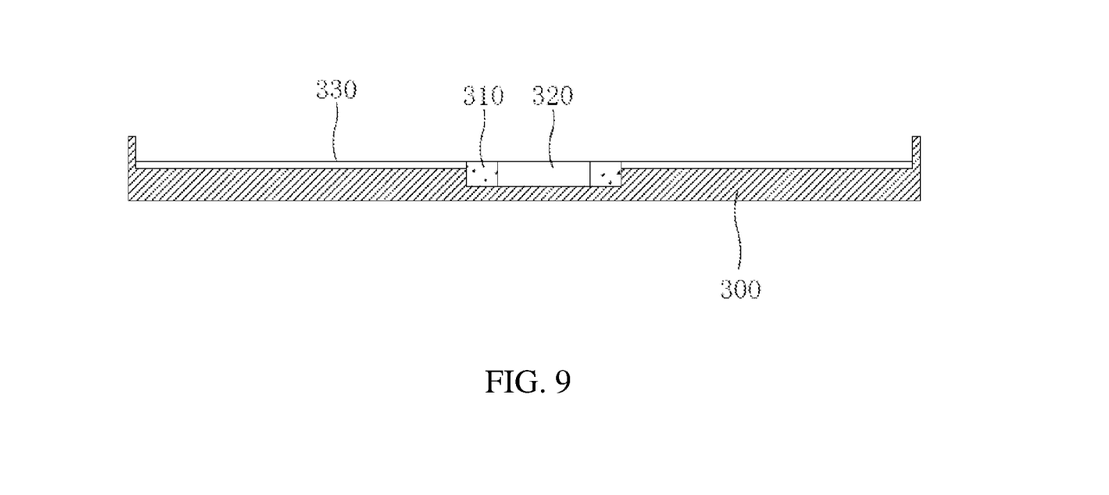
FIG. 9 illustrates a cross-sectional diagram on a mobile terminal protection shell in the matching assembly of the wireless charger in the present disclosure.

Specifically, in the embodiments stated above, the mobile terminal protection shell 300 is a protection shell having a special structure, that is, adjusting the structure and making a part of the area easy to conduct the temperature, that is forming a heat-conducting area, which is usually arranged in an area within a magnetic component attraction range, to facilitate a heat exchanging with the cooling unit mentioned above. On a structure, it is possible to process a certain area to reduce a thickness thereof compared to that of a plurality of other parts (such as a thickness within 0.8 mm), before filling with a heat conductor, making such an area easier for a heat exchange (FIG. 9). And a special embodiment of such an area is directly digging it out, before filling with a heat-conducting material, to make a cell phone shell be able to perform a heat conduction and a heat exchange between an inside and an outside thereof (see FIG. 10). The mobile terminal protection shell 300 conducts out the heat generated by the mobile terminal to an outside of the mobile terminal protection shell 300 through the heat conduction area. When the wireless charging function is not required, a filling material for the heat-conduction area can be a high thermal conductivity metal. If it is needed for a wireless charging, then the area adopts a non-metallic thermal conductive material (such as alumina, thermal conductive rubber, thermal conductive silicone sheet, and more). In an embodiment, when using a wireless charging assembly having a cooling function, at a position touching the wireless charging assembly 400, a low temperature generated by the semiconductor cooling sheet 220 in the wireless charging assembly 400 is transmitted to the mobile terminal protection shell 300, and further transferred to the mobile terminal through the mobile terminal protection shell 300, so as to cool down the mobile terminal.

Specifically, shown as FIG. 9, a side of the mobile terminal protection shell 300 applied to amounting the mobile terminal, has a recessed mounting part 320 arranged, a shape of the recessed mounting part 320 is as same as a shape of the magnetic connector 310, the magnetic connector 310 is embedded in the recessed mounting part 320. In a real arrangement, the magnetic connector 310 is a round ring-shaped component, accordingly, the shape of the recessed mounting part 320 is as same as the shape of the magnetic connector 310 arranged. The magnetic connector 310 may be made by adopting a magnetization sheet. A thickness of the magnetization sheet is extremely thin, and it can be pasted on the mobile terminal protection shell 300 in a form of a sticker. At a same time, the magnetization sheet does not need to distinguish a magnetic pole, which ensures a foolproof during a mounting process of the heat dissipater of the mobile terminal. On another hand, the magnetization sheet may have a plurality of patterns printed, improving a aesthetics of the mobile terminal protection shell 300 while achieving a magnetic attraction function, thereby increasing a market competitiveness. Or it is made of another original magnet material or a permanent magnet material, which is not limited in the present disclosure.

According to the embodiments described above, the mobile terminal protection shell 300 further has a heat conduction layer 330 arranged, and the heat conduction layer 330 is arranged at a corresponding position on a back side of the mobile terminal that is easy to generate heat, and a plurality of areas are interconnected with a plurality of corresponding areas of a thermal conduction sheet, so as to provide a convenience for the heat dissipation of the heat dissipater of the mobile terminal, while enhancing a heat dissipation efficiency of the mobile terminal.

The heat conduction layer 330 is laid on a side of the mobile terminal protection shell 300 facing to the mobile terminal, while clamping and fixing the magnetic connector 310 inside the mobile terminal protection shell 300, to prevent the magnetic connector 310 from falling off due to a long time usage.

Figure 10:
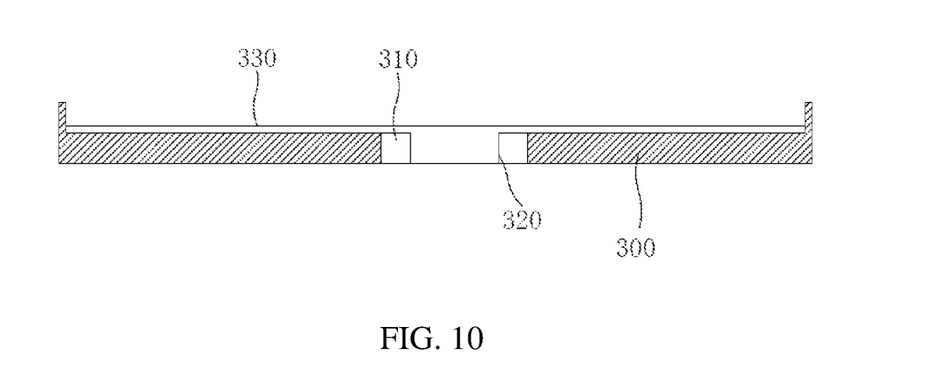
FIG. 10 illustrates a cross-sectional diagram on a second embodiment of the mobile terminal protection shell in the matching assembly of the wireless charger in the present disclosure.

Another implementation method of the present disclosure, shown as FIG. 10, a form of the recessed mounting part 320 may be arranged as a through hole in the mobile terminal protection shell 300, the magnetic connector 310 is snapped and arranged in the recessed mounting part 320 on a part close to an outside of the mobile terminal protection shell 300 (a lower part shown in the figure), while locating at a same level of an outside surface of the mobile terminal protection shell 300. Inside the mobile terminal protection shell 300 (a upper part shown in the figure), there is a laying position arranged for the heat conduction layer 330, and locating on a position engaging with the magnetic connector 310, snapped and arranged inside a ring body of the magnetic connector 310, to form a fixed connection with the magnetic connector 310. At a same time, the heat conduction layer 330 locating inside the magnetic connector 310 passes through the magnetic connector 310, and locates at the same level of the outside surface of the mobile terminal protection shell 300. A benefit of such an arrangement is, when a connection is formed with the wireless charging assembly 400, a low temperature on the wireless charging assembly 400 may be transferred directly to the mobile terminal through the heat conduction layer 330, to achieve a better cooling effect.

All above, the matching assembly of the wireless charger, by arranging the mobile terminal protection shell 300 having a function of magnetic attraction and heat conduction, is able to achieve a cooperation with the wireless charging assembly 400 when the mobile terminal itself has no magnetic attraction function, and performs a high efficient wireless charging, body temperature lowering as well as charging and temperature lowering at a same time, to improve a charging efficiency during a wireless charging process of the mobile terminal.

Figure 11:
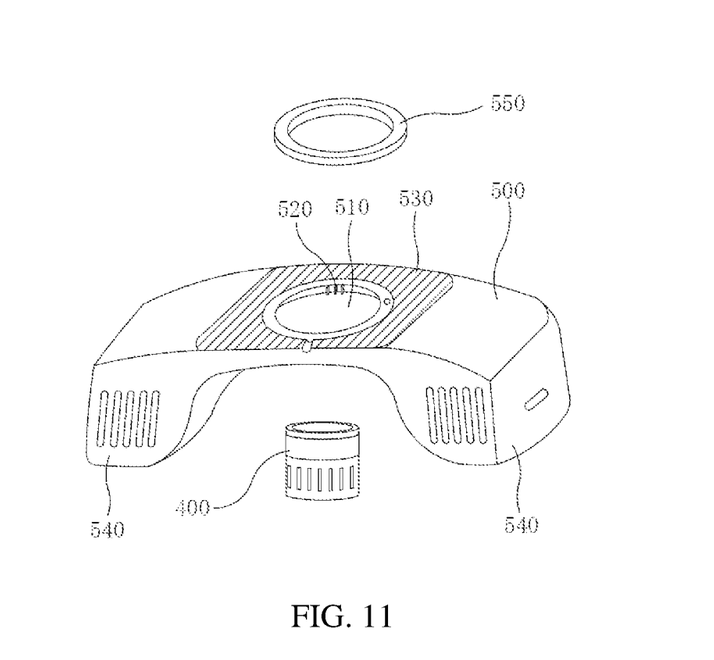
FIG. 11 illustrates a structural diagram on a first embodiment of a wireless charging bracket in the present disclosure.

The present disclosure further provides a wireless charging bracket, shown as FIG. 11, the wireless charging bracket comprises the wireless charging assembly 400 described in any one of the embodiments stated above.

The wireless charging bracket further comprises:
a support assembly 500, the wireless charging assembly described above is detachably arranged on the support assembly 500, when the mobile terminal is placed on the support assembly 500, the wireless charging assembly 400 arranged on the support assembly 500 is able to wireless charge the mobile terminal, while achieving a cooling to the mobile terminal in the wireless charging process, so as to ensure a charging efficiency of the mobile terminal during wireless charging.

The present embodiment, wherein the wireless charging bracket may be applied as a placement bracket for an indoor mobile terminal or a placement bracket for a vehicle loaded mobile terminal, so as to provide a convenience for a user to place the mobile terminal and perform the wireless charging.

Specifically, a first embodiment of the wireless charging bracket in the present disclosure, shown as FIG. 11, wherein the support assembly 500 has an assembly hole 510 arranged, a size of the assembly hole 510 matches a size of the first protection shell 110 in the wireless charging assembly 400. Similarly, it also matches the second protection shell 210. In a real application, it is possible to achieve an installation and mounting between the support assembly 500 and the wireless charging assembly 400 by snapping the wireless charging assembly 400 into the assembly hole 510.

An implementation method of the present disclosure, wherein an inner wall of the assembly hole 510 touching the first protection shell 110 and the second protection shell 210 further has a touch switch 520 arranged. Accordingly, a first power interface 131 in the first protection shell 110 is arranged in a style adapting to the touch switch 520, and a second power interface 243 in the second protection shell 210 is also arranged in the style adapting to the touch switch 520. After the wireless charging assembly 400 has been mounted with the support assembly 500, the touch switch 520 couples with the first power interface 131 and the second power interface 243 in the wireless charging assembly 400, to achieve a power supply to the wireless charging assembly 400.

Figure 12:
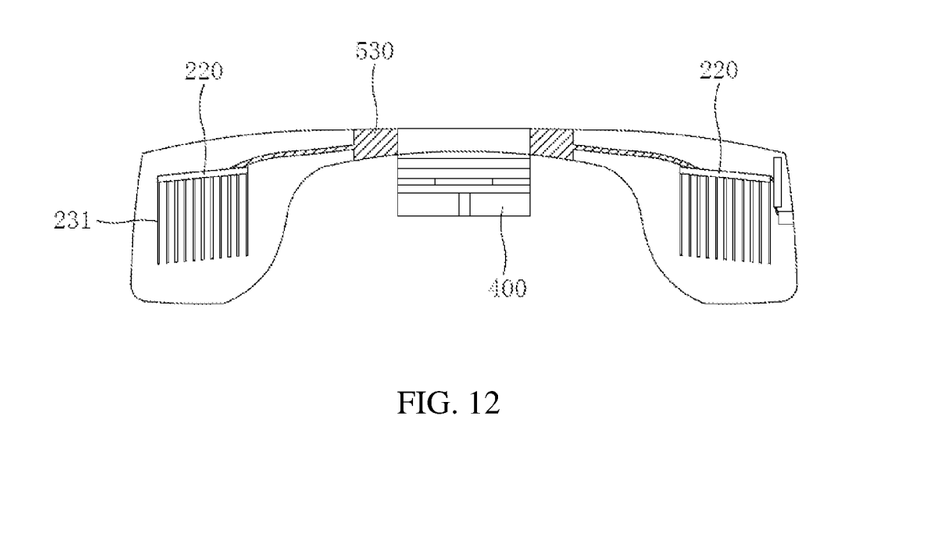
FIG. 12 illustrates a cross-sectional diagram on a first embodiment of the wireless charging bracket in the present disclosure.

According to the embodiments stated above, shown as FIG. 12, the support assembly 500 has a cooling unit arranged inside, the cooling unit is applied to cooling down a temperature of the wireless charging assembly 400. The present embodiment, wherein when the support assembly 500 is adopted to wireless charge the mobile terminal, a higher power charging performance may be applied. Due to the cooling unit arranged inside the support assembly 500 is able to achieve a temperature lowering to the wireless charging assembly 400 as a whole, thus it is possible to guarantee a possibility of achieving a high power wireless charging.

Specifically, the cooling unit stated above comprises a semiconductor cooling sheet 220, a heat dissipation fin 231, and a thermal conductive sticker 530, wherein the thermal conductive sticker 530 is arranged inside the assembly hole 510, at a position sticking to the first protection shell 110 and the second protection shell 210, a cooling end of the semiconductor cooling sheet 220 sticks to the thermal conductive sticker 530, to conduct a low temperature generated to the wireless charging assembly 400. The semiconductor cooling sheet 220, wherein a heat dissipation end sticks to a heat discharging sheet group, to achieve an effect of a heat dissipation to the semiconductor cooling sheet 220.

The embodiments stated above, wherein the support assembly 500 further comprises a positioning unit 540, shown as FIG. 11, a first embodiment of the present disclosure, wherein the positioning unit 540 is arranged as a foot style, to achieve fixing the support assembly 500 onto a preset position, as shown in the figure, the foot are arranged into two, and inside the two feet, there are two groups of cooling units arranged correspondingly, to meet a demand for a high-power cooling.

Figure 13:
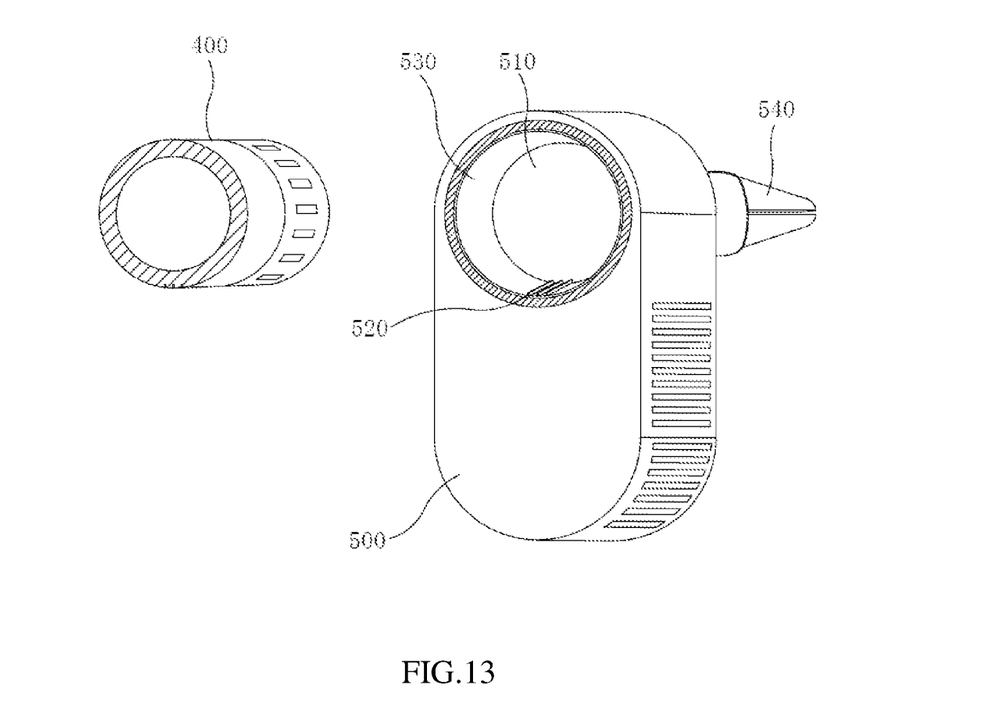
FIG. 13 illustrates a structural diagram on a second embodiment of the wireless charging bracket in the present disclosure.

A second embodiment of the present disclosure, shown as FIG. 13, wherein the positioning unit 540 may further be arranged in a latching style, applied to fixing onto an air outlet grille of an air condition in an automobile. An arrangement of the second embodiment in a whole is similar to the first embodiment, a difference locates in a function of the positioning unit 540 different, and an overall shape is modified adaptively. The present disclosure, wherein a plurality of other different shapes of the wireless charging bracket can be arranged according to different usage requirements, which is not limited herein.

According to the embodiments stated above, shown as FIG. 11, a side of the support assembly 500 sticking to the mobile terminal has an enhanced sticker 550 arranged, the enhanced sticker 550 is a permanent magnet ring. In a real arrangement, the permanent magnet ring is arranged detachably on a side of the support assembly 500 sticking to the mobile terminal. The enhanced sticker 550 matches with and fixes to the first mated mounting ring 140 in the first protection shell 110, so as to achieve an effect of a more stable arrangement.

All above, the wireless charging bracket provided by the present disclosure is able to achieve an effect of supporting the mobile terminal, so as to facilitate a vehicle-carried power charging or a lay-down power charging, and meet a plurality of different usage requirements.

All above, the present disclosure provides a wireless charger, a charging assembly, a matching assembly and a bracket for an electric equipment, wherein the wireless charger for the electronic equipment comprises: a cold conduction plate, a power interface, a wireless charging module, a semiconductor cooling sheet and a heat dissipation module; the power interface couples with the wireless charging module and the semiconductor cooling sheet respectively; the cold conduction plate comprises a first cold conduction surface and a second cold conduction surface, the first cold conduction surface is applied to sticking to the electronic equipment, and the second cold conduction surface is applied to covering the semiconductor cooling sheet; when the power interface is powered on, the wireless charging module charges the electronic equipment, the semiconductor cooling sheet cools down the electronic equipment, and the heat dissipation module dissipates heat from the semiconductor cooling sheet. The present disclosure arranges a semiconductor cooling sheet on a side of the wireless charging module sticking to an electronic equipment, cools down the electronic equipment. While arranging a heat dissipation module on another side, achieving a heat dissipation on another end of the semiconductor cooling sheet, so as to ensure a temperature balance of the semiconductor cooling sheet, which has solved effectively a problem of heat generation when wireless charging an electronic equipment, and affecting the charging efficiency.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:
1. A wireless charging assembly, comprising:
a wireless charging connector, comprising:
a first protection shell and a wireless charging module arranged in the first protection shell;
a cooling connector, comprising:
a second protection shell, a semiconductor cooling sheet and a heat dissipation module, both arranged in the second protection shell; and
the first protection shell is a heat conduction shell, a size of the first protection shell matches the size of the second protection shell, and the first protection shell connects magnetically to the second protection shell,
wherein the wireless charging module is embedded inside the first protection shell, a side of the wireless charging module has a first printed circular board arranged, the first printed circular board has a first power interface arranged, the first printed circular board electrically connects to the wireless charging module,
wherein an embossed engaging portion is arranged above the first protection shell, and the embossed engaging portion has a first mated mounting ring engaged and arranged; and
a width of the first mated mounting ring is as same as a height of the embossed engaging portion, the first mated mounting ring is sleeved on a side of the embossed engaging portion; a diameter of the first mated mounting ring matches a diameter of the first protection shell.

2. The wireless charging assembly according to claim 1, wherein the first protection shell has a bottom plate arranged on a bottom of a side against the first mated mounting ring, the bottom plate is an original magnet bottom plate; and
a side of the wireless charging module sticking to the first printed circular board has further a magnet isolation plate arranged, the magnet isolation plate is applied to improving an efficiency of the wireless charging module.

3. The wireless charging assembly according to claim 1, wherein the semiconductor cooling sheet is arranged inside the second protection shell, the heat dissipation module is arranged at an end of the semiconductor cooling sheet dissipating the heat, the second protection shell has a plurality of heat dissipation holes arranged, the heat dissipation holes is applied to conducting the heat from the heat dissipation module.

4. The wireless charging assembly according to claim 3, wherein a side of the semiconductor cooling sheet sticking to the heat dissipation module has a second printed circular board arranged, a center position of the second printed circular board has a mounting hole arranged, a shape of the mounting hole is as same as a shape of a cross section of the semiconductor cooling sheet, the semiconductor cooling sheet is embedded in and electrically connected to an inside of the mounting hole, the semiconductor cooling sheet sticks to the heat dissipation module.

5. The wireless charging assembly according to claim 4, wherein the heat dissipation module comprises a plurality of heat dissipation fins, the plurality of heat dissipation fins are arranged fixedly into a radial shape, the heat dissipation fins are made of a heat conductive metal; and the heat dissipation module further comprises a heat dissipation fan, the heat dissipation fan is arranged at a center position of the heat dissipation fin, and electrically connected to the second printed circular board.

6. The wireless charging assembly according to claim 4, wherein a cooling side of the second printed circular board facing to the semiconductor cooling sheet has a second mated mounting ring arranged, an inner diameter of the second mated mounting ring is larger than a diameter of a cross section of the semiconductor cooling sheet, the second mated mounting ring is sleeved on the semiconductor cooling sheet and fixedly arranged on the second printed circular board, the second mated mounting ring is a permanent magnet ring.

7. The wireless charging assembly according to claim 4, wherein the second printed circular board has a temperature sensor and a second power interface arranged, the temperature sensor is applied to controlling a temperature of the heat dissipation module, the second power interface is applied to supplying power to the semiconductor cooling sheet.

8. The wireless charging assembly according to claim 3, wherein an inside of the second protection shell further has a cold conduction plate arranged, a side of the cold conduction plate sticks to the semiconductor cooling sheet, another side thereof sticks to the first protection shell.

9. A matching assembly of a wireless charger, wherein the matching assembly of the wireless charger comprises the wireless charging assembly according to claim 1; and
the matching assembly of the wireless charger further comprises:
a mobile terminal protection shell, the mobile terminal protection shell has a magnetic connector arranged, a position of the magnetic connector arranged is corresponding to a wireless charging position of the mobile terminal, the magnetic connector is applied to fixing the mobile terminal protection shell onto the wireless charging assembly.

10. The matching assembly according to claim 9, wherein the mobile terminal protection shell is a heat conductive protection shell.

11. The matching assembly according to claim 9, wherein a side of the mobile terminal protection shell applied to amounting a mobile terminal has a recessed mounting part arranged, a shape of the recessed mounting part is as same as a shape of the magnetic connector, the magnetic connector is embedded in the recessed mounting part.

12. The matching assembly according to claim 11, wherein the magnetic connector is a round ring-shaped component, and the magnetic connector is a magnetization sheet.

13. The matching assembly according to claim 11, wherein an inside of the mobile terminal protection shell has a heat conductive layer arranged, the heat conductive layer clamps and fixes the magnetic connector to an inside of the mobile terminal protection shell.

14. A wireless charging bracket, wherein the wireless charging bracket comprises a wireless charging assembly according to claim 1; and
the wireless charging bracket further comprises:
a support assembly, the wireless charging assembly is detachably arranged on the support assembly, the support assembly is applied to supporting the mobile terminal, and wireless charging through the wireless charging assembly.

15. The wireless charging bracket according to claim 14, wherein the support assembly has an assembly hole arranged, the assembly hole matches a size of the first protection shell, the wireless charging assembly is snapped and arranged in the assembly hole.

16. The wireless charging bracket according to claim 15, wherein an inner wall of the assembly hole has a touch switch arranged, when the wireless charging assembly is arranged inside the assembly hole, the touch switch is coupled with the wireless charging assembly.

17. The wireless charging bracket according to claim 15, wherein the support assembly has a cooling unit arranged inside, the cooling unit is applied to cooling down a temperature of the wireless charging assembly, the support assembly further has a location unit arranged, the location unit is applied to fixing the support assembly.

18. The wireless charging bracket according to claim 17, wherein the cooling unit comprises a semiconductor cooling sheet, a heat dissipation fin, and a thermal conductive sticker, the thermal conductive sticker sticks to the first protection shell and the second protection shell, a cooling end of the semiconductor cooling sheet sticks to the thermal conductive sticker, a heat dissipation end of the semiconductor cooling sheet sticks to a heat discharging sheet group.

19. The wireless charging bracket according to claim 17, wherein a side of the support assembly sticking to the mobile terminal has an enhanced sticker arranged, the enhancing sticker is a permanent magnet ring.

* * * * *

UNITED STATES PATENT AND TRADEMARK OFFICE
CERTIFICATE OF CORRECTION

PATENT NO. : 11,317,544 B1  
APPLICATION NO. : 17/355429  
DATED : April 26, 2022  
INVENTOR(S) : Jianming Zeng

Page 1 of 1

It is certified that error appears in the above-identified patent and that said Letters Patent is hereby corrected as shown below:

On the Title Page

In items (71) and (73), the Applicant and Assignee should be changed from "SHENZHEN KE RUI ER TE Electronics Technology Co., Ltd, Shenzhen (CN)" to --Jianming Zeng, Shenzhen (CN)--.

Signed and Sealed this  
Twenty-eighth Day of June, 2022

Katherine Kelly Vidal  
*Director of the United States Patent and Trademark Office*